United States Patent [19]
Odani et al.

[11] Patent Number: 6,026,024
[45] Date of Patent: Feb. 15, 2000

[54] SEMICONDUCTOR MEMORY DEVICE

[75] Inventors: Nobutsugu Odani; Kazumasa Ohmori, both of Kawasaki, Japan

[73] Assignee: Fujitsu Limited, Kawasaki, Japan

[21] Appl. No.: 08/885,939

[22] Filed: Jun. 30, 1997

[30] Foreign Application Priority Data

Mar. 10, 1997 [JP] Japan .................................. 9-054449

[51] Int. Cl.$^7$ ................................................ G11C 16/00
[52] U.S. Cl. ............................... 365/185.22; 365/185.09
[58] Field of Search ..................... 365/185.22, 185.09, 365/185.28, 185.29, 185.3

[56] References Cited

U.S. PATENT DOCUMENTS

| | | | |
|---|---|---|---|
| 5,428,569 | 6/1995 | Kato et al. | 365/185.22 |
| 5,586,074 | 12/1996 | Higuchi | 365/185.22 |
| 5,652,720 | 7/1997 | Aulas et al. | 365/185.09 |
| 5,708,602 | 1/1998 | Yamada | 365/185.22 |

*Primary Examiner*—Tan T. Nguyen
*Attorney, Agent, or Firm*—Nikaido, Marmelstein, Murray & Oram, LLP

[57] ABSTRACT

In nonvolatile semiconductor memory devices, during program write operations for example, writing is accomplished by changing the threshold condition until the output from a memory cell exceeds the read verify level. During read operations, it is determined whether a target memory cell has been programmed or not by sensing whether the output from the memory cell exceeds a prescribed read level. When the data retention capability of a memory cell declines, the threshold condition of the memory cell changes. If the output of the memory cell changes to a level at which the output does not exceed the read level, the wrong data is read out. In the present invention, a monitor level which differs from the read level is established, and in the event that the output from a memory cell changes such as to approach this monitor level, this fact is sensed in advance, thereby preventing readout of wrong data. In the event that it is sensed that memory cell output has changed such as to reach the monitor level, write operation is performed on the memory cell again.

6 Claims, 11 Drawing Sheets

| MODE | GATE (WORD-LINE) | DRAIN (BIT-LINE) | SOURCE (SOURCE) |
|---|---|---|---|
| READ | VCC | 2V | 0V (GND) |
| PROGRAM | 12V | 6V | 0V (GND) |
| ERASE | -10V | OPEN | 5V |

DATA "0"

DATA "1"

SEMICONDUCTOR MEMORY DEVICE

BACKGROUND OF THE INVENTION

1. Field of the Invention

The present invention relates to a semiconductor memory, and more particularly to a semiconductor memory device that makes possible self-correction of stored data in nonvolatile memories, particularly those used in flash memories and the like.

2. Description of the Related Art

Nonvolatile memories used in flash memories and the like are provided, for example, with an architecture wherein a control gate is disposed over a floating gate in the channel region on the semiconductor substrate surface. By applying a prescribed voltage to the control gate, source, and drain, electrons are retained within the floating gate, thereby writing a logical "0" (program), or electrons are removed from the floating gate, thereby writing a logical "1" (erase). Alternatively, logical "0"s and "1"s are written utilizing the residual polarizing action of a ferroelectric film formed on the channel.

The written state is retained even in the absence of supplied power. Such nonvolatile memories can retain stored data for long periods, for example, 10 years or more.

Demands for increased capabilities on the part of nonvolatile memories have led to increasing miniaturization of memory cells. This miniaturization poses the problem in diminished data retention capability on the part of memory cells.

FIG. 14 is a diagram illustrating the change in data held in a floating gate type nonvolatile memory. Time is plotted on the horizontal axis and the threshold voltage, Vth, of the memory cell transistor is plotted on the vertical axis. When, for example, a high voltage is applied to the control gate of the memory cell, the floating gate is caused to retain electrons so that the threshold voltage of the memory cell transistor becomes substantially high. This state represents, for example, writing of a logical "0".

It is common practice during write logical "0" program operations to verify whether enough electrons are retained in the floating gate by, for example, comparing a program verify level $V_{PGM}$ with the output voltage corresponding to the drain current when a prescribed voltage is applied to the control gate. Alternatively, a program verify level $V_{PGM}$ is applied to the control gate, and it is verified that a memory cell drain current can be sensed. Accordingly, the program operation continues until the output voltage from the memory cell exceeds the program verify level $V_{PGM}$, or until drain current is sensed when the program verify level $V_{PGM}$ is applied. When data stored in the memory cell is read out, a read level $V_{read}$ is applied to the control gate and the presence or absence of memory cell transistor drain current is sensed.

The electrons retained within the floating gate are subjected to electrical stresses and are gradually depleted during program (logical "0" writes), erase (logical "1" writes), and read operations to adjacent memory cells. In some cases, the data retention capability of a memory cell may decline due to various stresses produced during processing. Normally, a logical "0" state is guaranteed to be maintained for about 10 years, for example, despite the electron leakage. That is, it is guaranteed that once a logical "0" has been written, the memory cell transistor will conduct when a read level $V_{read}$ is applied to the control gate.

However, the electrical stresses cited earlier can cause the data retention capability of a memory cell to decline so that a logical "0" state can no longer be maintained before the warranty period has elapsed. That is, electrons are lost so that the threshold voltage Vth declines until point 10 in FIG. 14 is reached. The decline in data retention capability is particularly marked with the smaller memory cell transistor sizes associated with increased capacity.

This decline in stored data retention capability poses a similar problem when electrons are removed from the floating gate to store a logical "1". That is, after a low voltage has been applied to the control gate to remove the electrons, subsequent electron injection occurs as a result of electrical stresses, producing a rise in the threshold voltage of the memory cell so that the stored data changes from a "1" to a "0".

SUMMARY OF INVENTION

It is an object of the present invention to solve the problems noted earlier by providing a nonvolatile memory device that can prevent loss of stored data, even in a memory device which includes memory cells having diminished data retention capability.

It is a further object of the present invention to provide a nonvolatile memory device that allows the duration of data retention to be adequately extended.

To achieve the aforementioned objects, the present invention is a nonvolatile semiconductor memory device in which each memory cell transistor is maintained at a threshold condition in accordance with stored data, comprising a write circuit for changing the threshold condition to perform a stored data write operation until the output from the memory cell, which changes in accordance with the threshold condition of the memory cell, reaches a prescribed write verify level, a read sensor circuit for sensing whether the output from the memory cell exceeds a prescribed read level, and a stored data degradation sensor circuit for sensing whether the output from the memory cell exceeds a monitor level, which differs from the read level, wherein, in the event that the stored data degradation sensor circuit senses that the output of the memory cell does not exceed the monitor level, and the read sensor circuit senses that the output of the memory cell exceeds the read level, the read sensor circuit performs a stored data rewrite operation to rewrite a stored data detected by the read sensor circuit to the memory cell.

In nonvolatile semiconductor memory devices, during program write operations for example, writing is accomplished by changing the threshold condition until the output from a memory cell exceeds the read verify level. During read operations, it is determined whether a target memory cell has been programmed or not by sensing whether the output from the memory cell exceeds a prescribed read level. When the data retention capability of a memory cell declines, the threshold condition of the memory cell changes. If the output of the memory cell changes to a level at which the output does not exceed the read level, the wrong data is read out.

In the present invention, a monitor level which differs from the read level is established, and in the event that the output from a memory cell changes such as to approach this monitor level, this fact is sensed in advance, thereby preventing readout of wrong data. In the event that it is sensed that memory cell output has changed such as to reach the monitor level, write operation is performed on the memory cell again.

Accordingly, this monitor level should be prescribed level set between the write verify level and read level, or a level equivalent to the write verify level.

In accordance with the present invention, data degradation is sensed in advance and a rewrite operation is performed, thereby ensuring data retention for a substantially adequate period, even where memory cells having diminished data retention capability are present.

DESCRIPTION OF THE PREFERRED EMBODIMENTS

An embodiment of the present invention will be described making reference to the appended drawings. The embodiment should not be construed to imply any limitation of the technical scope of the invention.

Figures 1, 2:
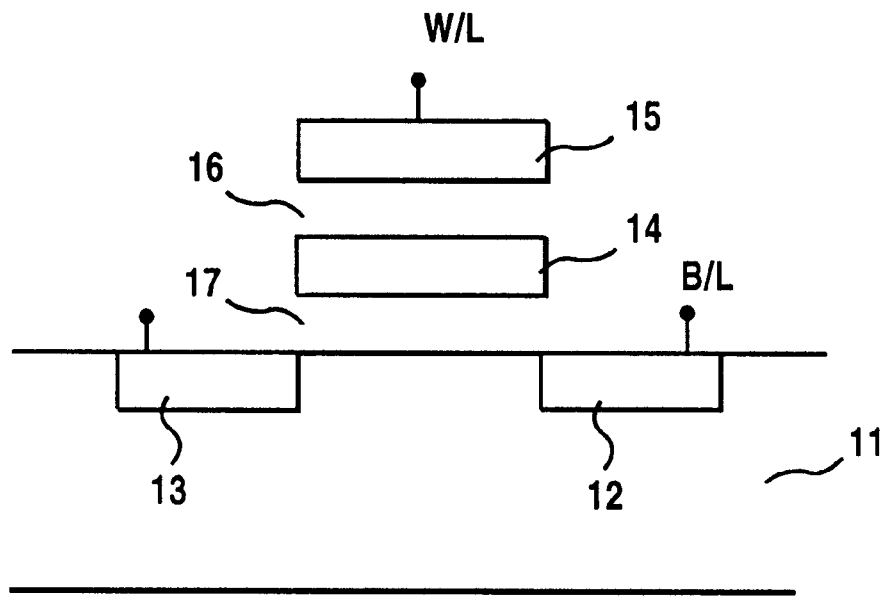
FIG. 1 is a diagram depicting the architecture of the transistor of a memory cell in an ordinary nonvolatile memory.
FIG. 2 is a chart depicting the relationships of gate, drain, and source voltage in various modes of the memory cell of FIG. 1.

FIG. 1 is a diagram illustrating the architecture of a memory cell transistor in an ordinary nonvolatile memory. Over the channel region, which is located between the drain 12 and source 13 formed on the surface of a silicon semiconductor substrate 11, are formed a floating gate 14 and a control gate 15, with insulating films 16 and 17 interposed. The control gate 15 is connected, for example, to a word line W/L and the drain 12 to a bit line B/L.

FIG. 2 is a chart depicting the relationships of gate, drain, and source voltage in various modes of the memory cell of FIG. 1. In read mode READ, the power supply $V_{CC}$ is applied to the control gate as the read level $V_{read}$, 2 V is applied to the drain, and 0 V is applied to the source, and the presence or absence of drain current is checked to determine if the transistor is in the conducting state.

During a program mode PROGRAM, the device assumes, for example, logical "0" write mode. In the example illustrated in FIG. 2, a high voltage, for example, 12 V, is applied to the control gate, 6 V is applied to the drain, and 0 V is applied to the source. Hot electrons are produced in the channel region, and electrons accumulate in the floating gate 14. As a result, the threshold voltage of the memory cell transistor rises substantially.

During an erase mode ERASE, −10 V, for example, is applied to the control gate 15 and 5 V is applied to the source, whereby the electrons within the floating gate are removed. As a result, the threshold voltage of the memory cell transistor declines. In other words, a logical "1" is written.

Figure 3:
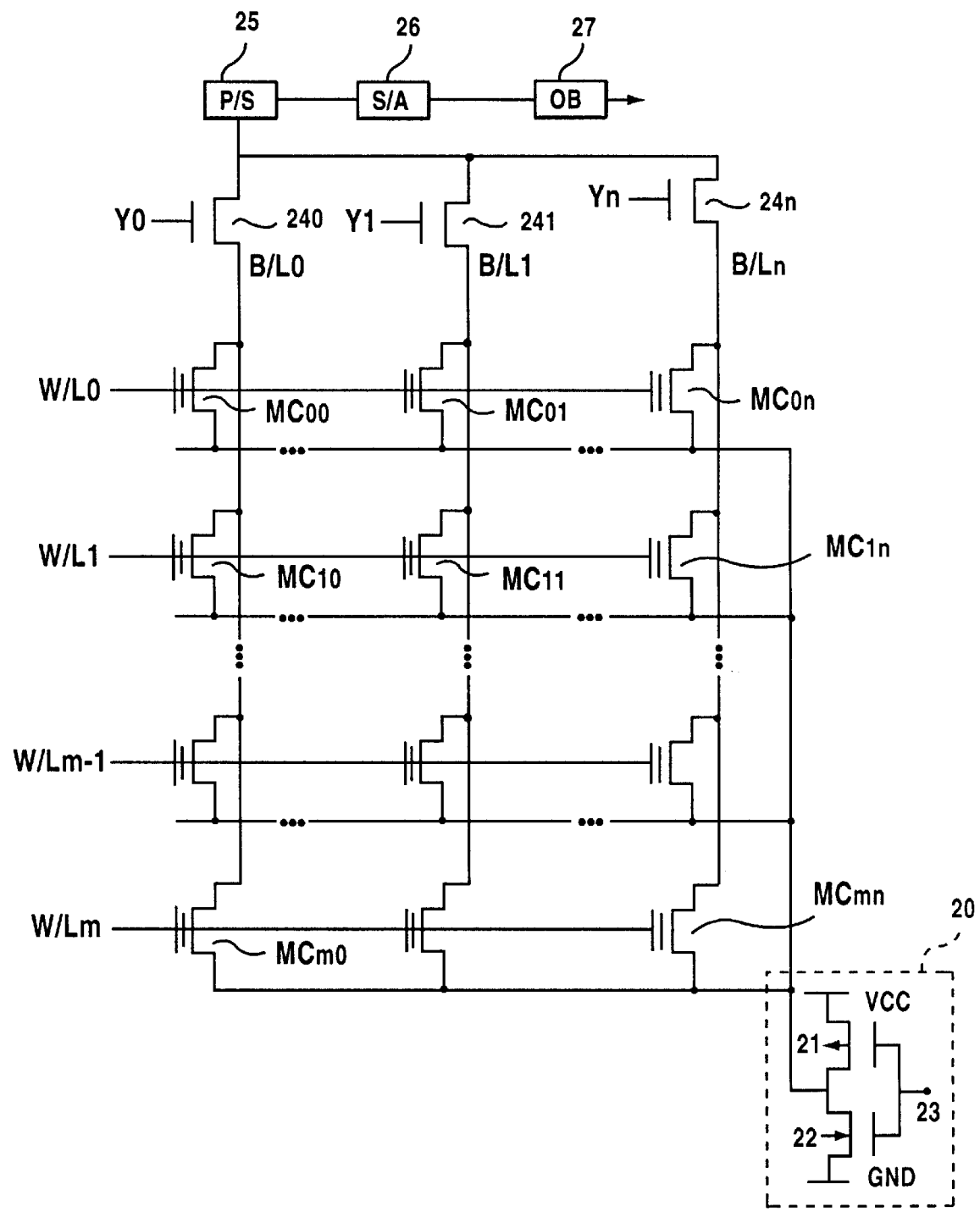
FIG. 3 is a diagram depicting an example of a nonvolatile memory circuit.

FIG. 3 depicts an example of a nonvolatile memory circuit. In this example, memory cells MC are disposed in m rows and n columns. The control gate of each memory cell MC is connected to a word line W/L0 through m. The drain of each memory cell MC is connected to a bit line B/L0 through n. The memory cell MC sources are connected to a switching circuit 20.

Each bit line B/L is connected through bit line selection gates 240 through 24n to a pre-sense amplifier 25. Accordingly, through bit line selection signals Y0 through Yn applied to the bit line selection gates 240 through 24n, the desired bit line B/L is connected in an exclusive manner to the pre-sense amplifier 25, and the read operation is performed. The voltage sensed by the pre-sense amplifier 25 is sensed and amplified by a sense amplifier 26 and provided in the form of an amplified signal to an output buffer circuit 27.

Through the switching circuit 20 connected to the source of each memory cell MC, cells are maintained at ground potential during the read and program modes and at, for example, 5 V during erase mode, in accordance with a control signal 23 for switching between read mode or program mode and erase mode, as shown in FIG. 2. In other words, transistors 21 and 22 are switched on and off.

Figure 4:
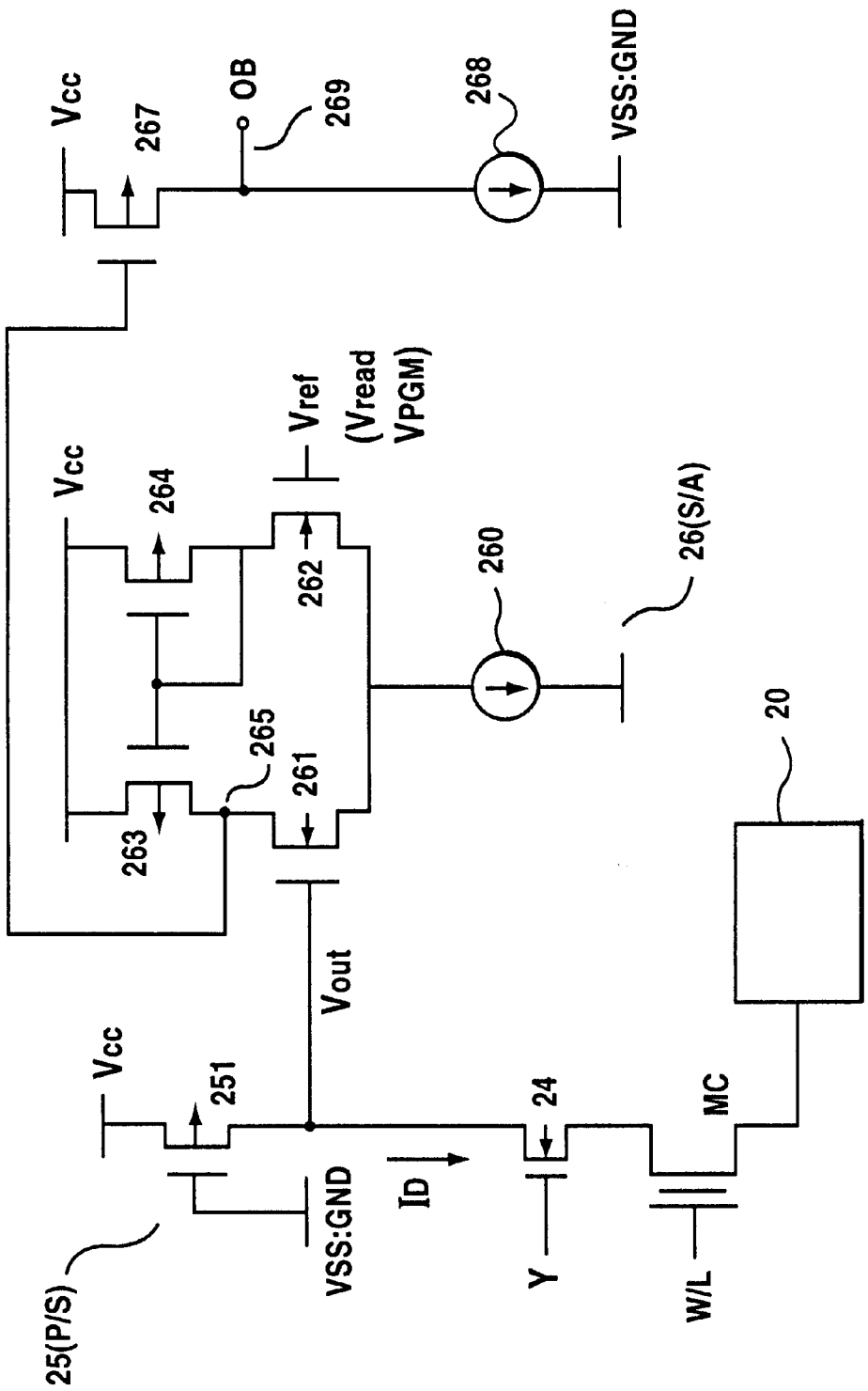
FIG. 4 is a diagram depicting examples of a preamplifier circuit and a sense amplifier circuit.

FIG. 4 depicts an example of the preamplifier circuit and the sense amplifier circuit. The pre-sense amplifier circuit 25 is connected to a memory cell MC through the bit line selection gate 24. In this pre-sense amplifier circuit 25, a p MOS transistor 251, for example, is disposed between the power source $V_{CC}$ and the memory cell MC. The gate thereof is connected to ground potential, and the transistor 251 is a normally conductive load circuit. Accordingly, in read mode, the power supply $V_{CC}$ is applied to the word line WL, whereupon a memory cell drain current $I_D$ is produced according to the data held in the memory cell.

In the logical "0" state, in which electrons are retained in the floating gate of the memory cell, the threshold voltage of the cell transistor rises, and even if the word line W/L should reach the power source $V_{CC}$ level, no drain current $I_D$ is produced and the preamplifier circuit 25 output $V_{out}$ potential becomes high. On the other hand, in the logical "1" state, in which electrons are not retained in the floating gate of the memory cell, the threshold voltage of the cell transistor drops, and when the word line W/L reaches the power source $V_{CC}$ level, drain current $I_D$ is produced and the preamplifier circuit 25 output $V_{out}$ potential becomes low.

By setting the reference voltage $V_{ref}$ in the sense amplifier circuit 26 to some intermediate potential, the presence or absence of a drain current $I_D$ is sensed and the stored data in the memory cell can be read out. This intermediate potential serves as the read level $V_{read}$. In the example in FIG. 4, in the sense amplifier circuit 26, a pair of N type transistors 261, 262 to which the sources are connected in common is connected to a current source 260, and loads comprising P type transistors 263 and 264 are respectively connected thereto. The pre-sense amplifier circuit 25 output $V_{out}$ and the reference voltage $V_{ref}$ are compared, and the transistor 261 is turned on or off depending on the result of the comparison, whereupon the drain terminal 265 of the transistor 261 accordingly assumes L or H level and is provided to the gate of a p transistor 267 on the output side. The circuit comprising the transistor 267 and the current source 268 inverts the terminal 265 level and provides this to the output terminal 269. The output terminal 268 is connected to an output buffer OB.

Accordingly, when electrons are held in the floating gate of the memory cell such that a logical "0" is stored therein, the transistor of the memory cell has a high threshold value and does not assume the conducting state during read operations, the output $V_{out}$ goes to H level, the terminal 265 goes to L level, and the output 269 goes to H level. Conversely, when electrons are not held in the floating gate of the memory cell such that a logical "1" is stored therein, the output $V_{out}$ and the 269 both go the L level. Thus, in the example in FIG. 4, the memory cell transistor threshold level and the pre-sense amplifier output $V_{out}$ have a similar relationship.

Figure 5:
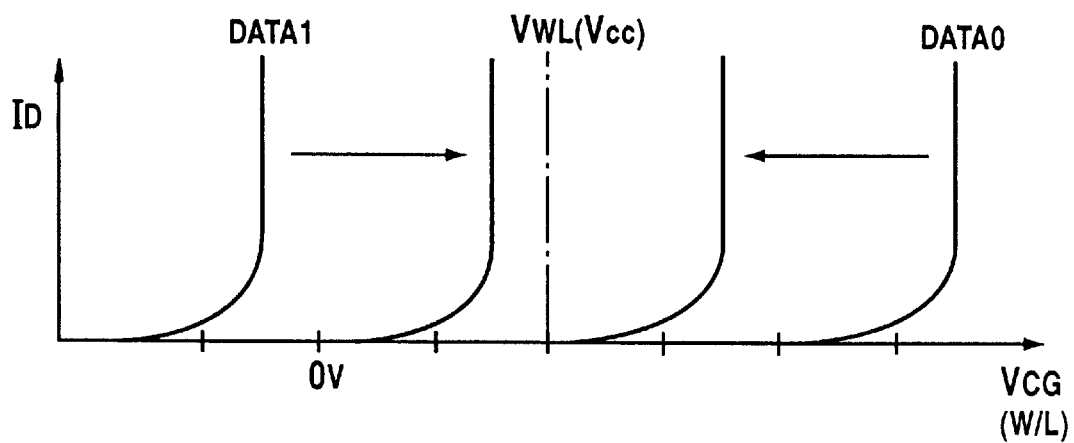
FIG. 5 is a diagram depicting threshold value Vth characteristics for a memory cell transistor.

FIG. 5 shows the characteristics of the threshold value Vth of the memory cell transistor. Specifically, it depicts the relationship between the voltage $V_{CG}$ applied to the memory cell control gate and the memory cell transistor drain current $I_D$. When a logical "0" is written, the threshold voltage rises, and the drain current $I_D$ starts to be produced when the control gate voltage $V_{CG}$ is increased. Conversely, where a logical "1" is written, the threshold voltage drops, and drain current $I_D$ flows even when the control gate voltage $V_{CG}$ is lowered.

When storage retention capability deteriorates with changes over time, the characteristics of the transistor of a memory cell holding a logical "0" shift to the left in the manner indicated by the arrow in FIG. 5. That is, the threshold voltage declines. Conversely, the characteristics of the transistor of a memory cell holding a logical "1" shift to the right and the threshold voltage rises. Accordingly, the margin with respect to the voltage $V_{WL}$ ($V_{CC}$) applied to the word line during reading narrows. Eventually, this relationship becomes reversed, and the data that is read out is not the stored data, resulting in loss of data.

Figure 6:
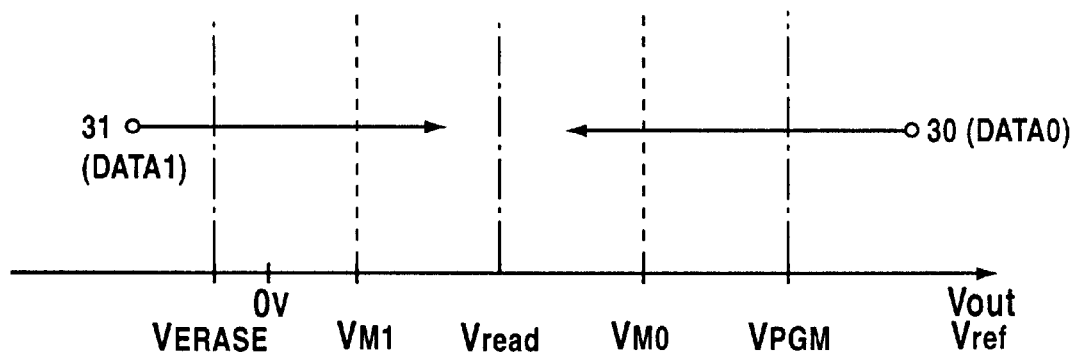
FIG. 6 is a diagram depicting preamplifier and sense amplifier characteristics.

Pre-sense amplifier and sense amplifier characteristics are shown in FIG. 6. As noted earlier, deterioration of the data retention capability of a memory cell causes the threshold voltage to change. Accordingly, the output $V_{out}$ of the pre-sense amplifier 25 depicted in FIG. 4 changes. For example, when the read level $V_{read}$ is provided as the reference voltage $V_{ref}$ for the sense amplifier 26, the output $V_{out}$ goes to the level indicated by 30 in the drawing in the event that a logical "0" is stored. If the threshold value Vth of the memory cell transistor should decline due to deterioration of the data retention capability, the drain current $I_D$ increases and the output $V_{out}$ drops. Eventually, it drops below the read level $V_{read}$, resulting in loss of data.

In the event that a logical "1" is stored, the output $V_{out}$ rises in association with the rise in the threshold value Vth of the memory cell transistor due to the deterioraiton, as indicated by 31 in the drawing. Eventually, it rises above the read level $V_{read}$, resulting in loss of data.

In FIG. 6, the program verify level $V_{PGM}$ is used to verify that the output $V_{out}$ is sufficiently high during program operations in which a logical "0" is written. Similarly, the erase verify level $V_{ERASE}$ is used to verify that the output $V_{out}$ is sufficiently low during erase operations in which a logical "1" is written. Accordingly, after programming or erasure, there is a sufficient margin between the output $V_{out}$ level and the read level $V_{read}$.

It may be seen from FIGS. 5 and 6 that as the data retention capability of a memory cell deteriorates, its threshold value Vth changes, and that, similarly, the pre-sense amplifier output $V_{out}$ when a prescribed voltage is applied to the control gate also changes.

Figure 7:
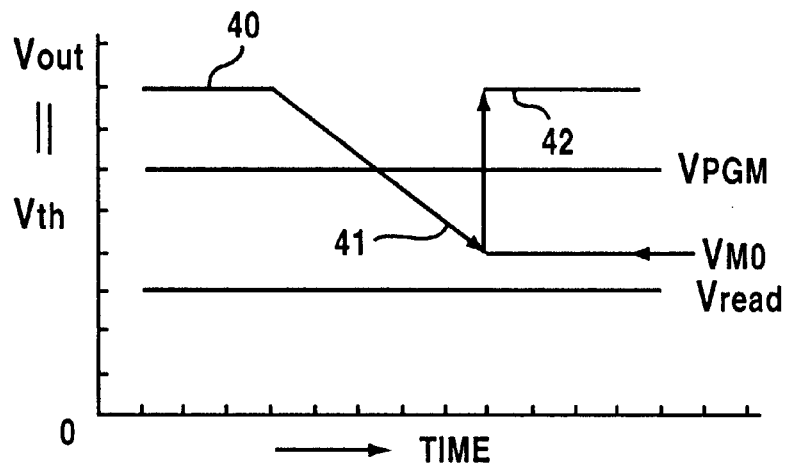
FIG. 7 is a diagram illustrating an embodiment of the present invention when a logical "0" is stored.

FIG. 7 illustrates an embodiment of the present invention when a logical "0" is stored. In the drawing, time is plotted on the horizontal axis and the pre-sense amplifier output $V_{out}$ and memory cell threshold value Vth are plotted on the vertical axis. As noted above, the threshold value Vth and output $V_{out}$ undergo similar changes in this embodiment, and accordingly can be described in similar terms.

During a program operation, the transistor threshold value Vth or output $V_{out}$ are each at a position 40 higher than the corresponding program verify level $V_{PGM}$. However, this level changes lower in memory cells whose data retention capability has deteriorated. In this embodiment, a logical "0" monitor level $V_{M0}$ is established. This monitor level $V_{M0}$ is, for example, set to a level lower than the program verify level $V_{PGM}$ but higher than the read level $V_{read}$.

Each time the memory cell is read, a check is performed to verify that the threshold value Vth or output $V_{out}$ has not reached the monitor level $V_{M0}$ or fallen below it. If it is sensed that the relevant value Vth or $V_{OUT}$ has dropped to the monitor level $V_{M0}$, as indicated by 41 in the drawing, the likelihood of data loss occurring is deemed high, so a stored logical "0" rewrite operation is performed as indicated by 42 in the drawing so that the relevant value Vth or $V_{OUT}$ exceeds the level $V_{PGM}$. Alternatively, a data loss warning signal is issued.

Figure 8:
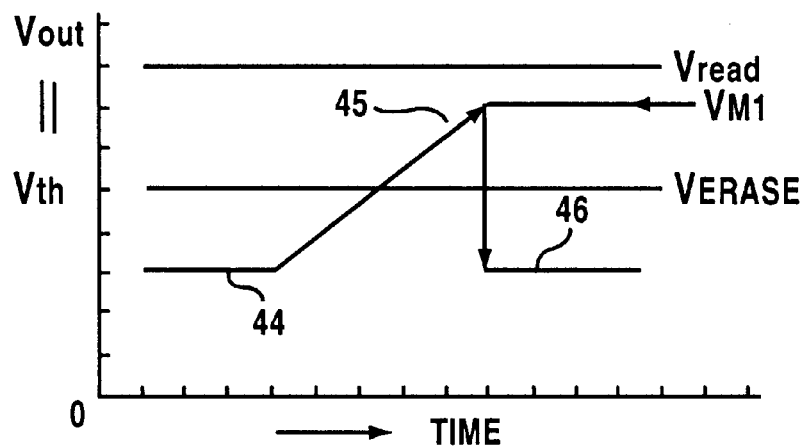
FIG. 8 is a diagram illustrating an embodiment of the present invention when a logical "1" is stored.

FIG. 8 illustrates an embodiment of the present invention when a logical "1" is stored. In the drawing, time is plotted on the horizontal axis and the pre-sense amplifier output $V_{out}$ and memory cell threshold value Vth are plotted on the vertical axis. As noted above, the threshold value Vth or output $V_{out}$ undergo similar changes, and accordingly can be described in similar terms.

During an erase operation, the transistor threshold value Vth or output $V_{out}$ are each at a position 44 lower than the corresponding erase verify level $V_{ERASE}$. However, this level changes higher in memory cells whose data retention capability has deteriorated. In this embodiment, a logical "1" monitor level $V_{M1}$ is established. This monitor level $V_{M1}$ is, for example, set to a level higher than the erase verify level $V_{ERASE}$ but lower than the read level $V_{read}$.

Each time the memory cell is read, a check is performed to verify that the threshold value Vth or output $V_{out}$ has not reached the monitor level $V_{M1}$ or risen above it. If it is sensed that the relevant value Vth ot $V_{OUT}$ has risen to the monitor level $V_{M1}$, as indicated by 45 in the drawing, the likelihood of data loss occurring is deemed high, so a stored logical "1" rewrite operation is performed as indicated by 46 in the drawing so that the relevant value Vth or $V_{OUT}$ exceeds the level $V_{ERASE}$. Alternatively, a data loss warning signal is issued.

Figure 9:
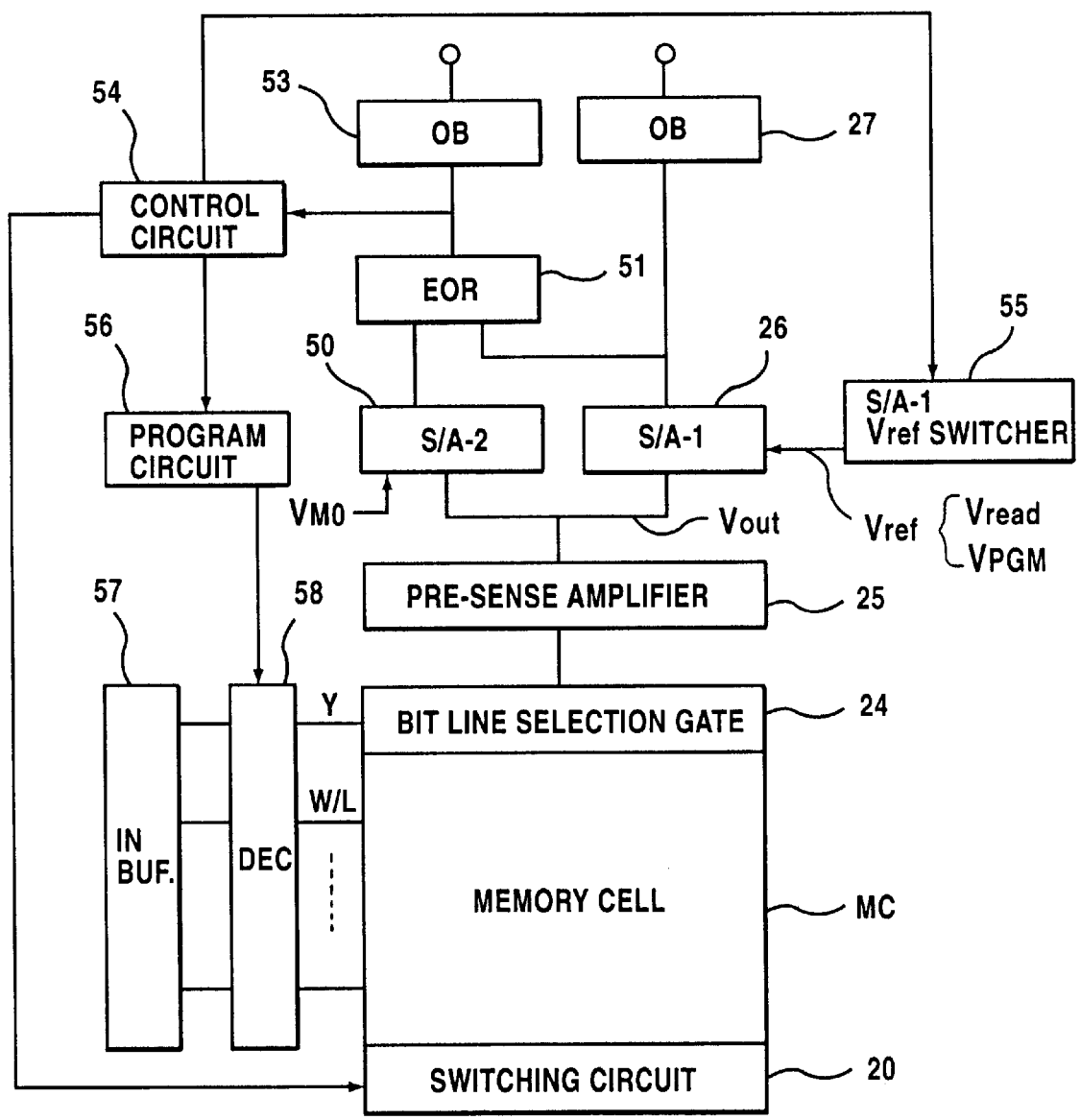
FIG. 9 is a circuit block diagram of a memory device pertaining to an embodiment of the present invention as relates to a stored logical "0"

FIG. 9 is a circuit block diagram of a memory device pertaining to an embodiment of the present invention as relates to a stored logical "0". In this example, the memory cell array MC, switching circuit 20, bit line selection gate 24, pre-sense amplifier 25, sense amplifier 26, and output buffer 27 shown in FIGS. 3 and 4 are provided. Additionally, a second sense amplifier 50 and an EOR circuit 51 for sensing whether the outputs of the two sense amplifiers 26 and 50 are the same or not are provided. A control circuit 54 controls the write circuit 56 and sense amplifier 26 reference voltage $V_{ref}$ on the basis of the output of the EOR circuit 51. A second output buffer 53 outputs the output of the EOR circuit 51.

In this circuit example, as in conventional ones, the first sense amplifier 26 is provided, as reference voltages, with a read level $V_{read}$ for use in read operations and a program verify level $V_{PGM}$ for use in program operations. Switching thereof is accomplished through control of the reference voltage switching circuit 55 by the control circuit 54. A logical "0" monitor level $V_{M0}$ is provided as a reference voltage to the second sense amplifier 50. The second sense amplifier 50 has the same architecture as the sense amplifier circuit shown in FIG. 4.

Accordingly, in read mode, the output of the pre-sense amplifier 25 is provided to the two sense amplifiers 26 and 50. The sense amplifier 26 senses whether the output $V_{out}$ is higher or lower than the read level $V_{read}$. The second sense amplifier 50 senses whether or not the output $V_{out}$ has declined to the monitor level $V_{M0}$. The outputs of the two sense amplifiers 26 and 50 are provided to the EOR circuit 51 which senses whether or not they are the same.

As shown in FIG. 7, when data retention capability declines, the threshold value Vth of the transistor of the memory cell gradually drops. The output $V_{out}$ of the pre-sense amplifier gradually declines in association therewith. Accordingly, when the threshold value Vth or output $V_{out}$ drop to below the corresponding monitor level $V_{M0}$, as indicated by 41 in FIG. 7, the output of the sense amplifier 26 and that of the second sense amplifier 50 differ, so the output of the EOR circuit 51 goes to H level. The output of the EOR circuit 51, which senses this difference, is output to the outside by the output buffer 53. At the same time, it is provided to the control circuit 54.

On the other hand, where a logical "1" is stored in a memory cell, the outputs of two sense amplifiers 26 and 50 are the same, so the output of the EOR circuit 51 always remains that output when identical inputs are sensed.

Figure 10:
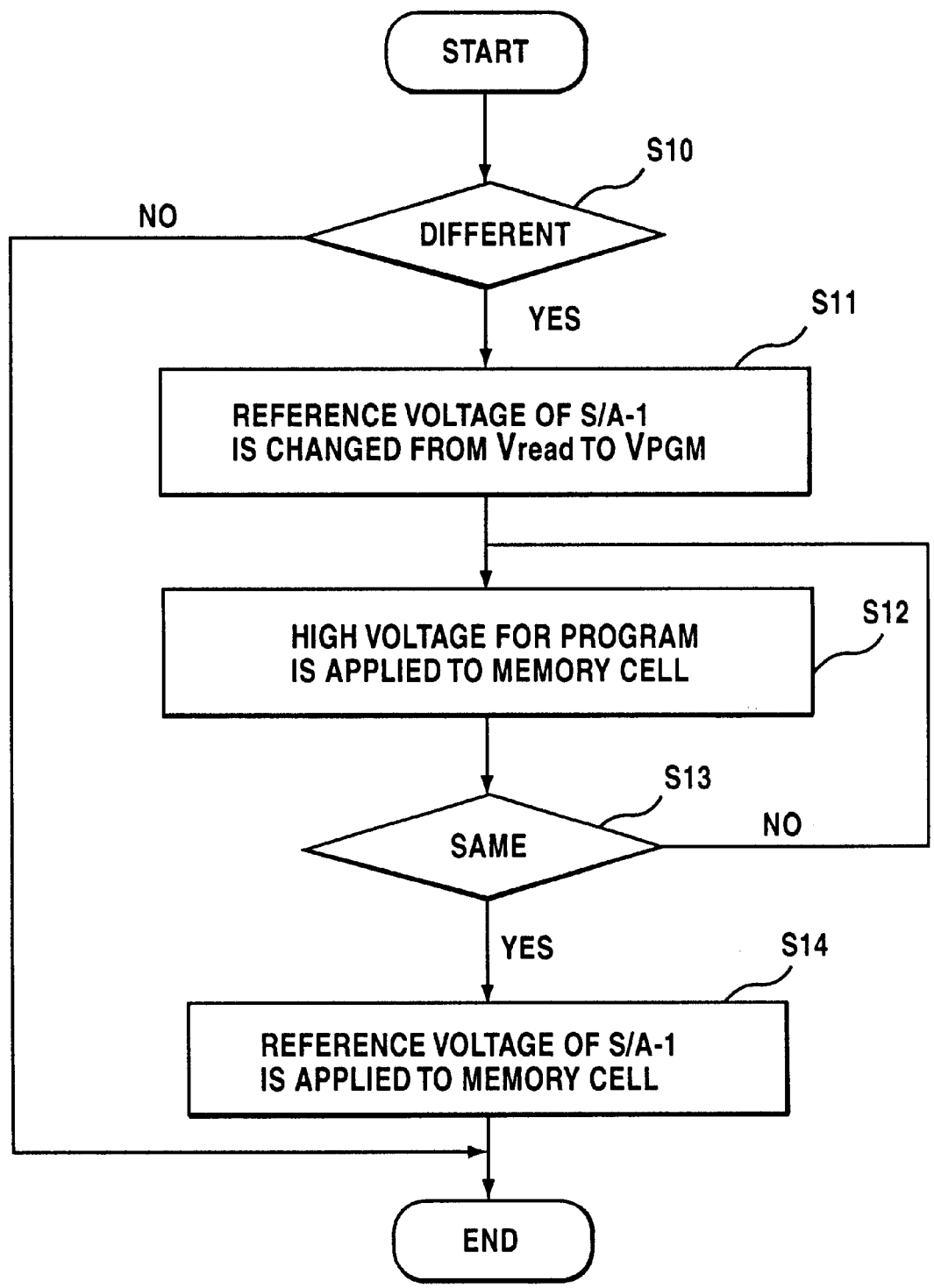
FIG. 10 is a flow chart of a re-write operation conducted in the event that deterioration of a stored logical "0" has been detected.

FIG. 10 shows a flow chart of a re-write operation conducted in the event that deterioration of the aforementioned stored logical "0" has been detected. Specifically, when it is sensed during reads of data stored in a memory cell that the outputs of the two sense amplifiers 26 and 50 are different, a determination is made that loss of the stored logical "0" is imminent (step S10). In this case, the reference voltage switching circuit 55 is controlled by the control circuit 54 so that the verify level $V_{PGM}$ is provided as reference voltage to the sense amplifier 26 (step S11). The control circuit 54 then controls the write circuit 56 such that a re-write is performed on the memory cell in which deterioration of the stored logical "0" has occurred. Specifically, a high program voltage (12 V, for example) is applied from a word line decoder driver circuit 58 to the word line W/L to which the memory cell is connected (step S12), and 0 V is applied to the source of the memory cell transistor by the switching circuit 20.

As a result, electrons are injected into the floating gate of the memory cell transistor. As shown in FIG. 7, the gradually declining threshold value Vth of the memory cell transistor rises above the corresponding monitor level $V_{M0}$ as soon as a high programming voltage is applied. Accordingly, the output $V_{out}$ of the sense amplifier 50 at this point in time rises above the monitor level $V_{M0}$. To ensure a more complete rewrite of the logical "0", the high programming voltage for rewriting continues to be applied until the sense amplifier 26 output $V_{out}$ rises above the program verify level $V_{PGM}$.

When it is sensed that the sense amplifier 26 output $V_{out}$ has risen above the program verify level $V_{PGM}$, it generates an output that is the same as that of the sense amplifier 50. Accordingly, when the EOR circuit 51 senses that the two outputs are the same (step S13), the re-write of the logical "0" is terminated and the read level $V_{read}$ is again provided as the reference voltage $V_{ref}$ to the sense amplifier 26 (step S14).

Figure 11:
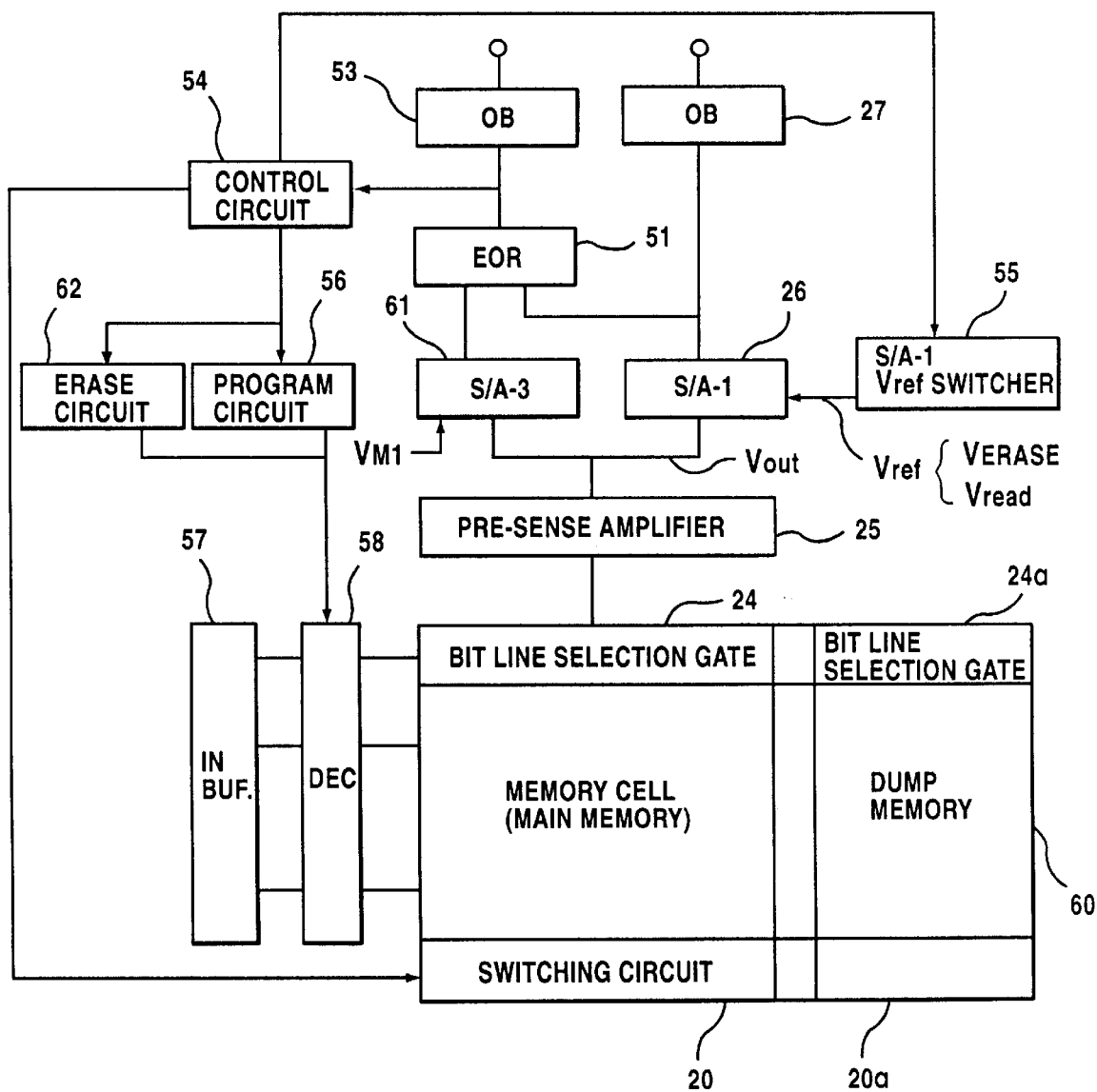
FIG. 11 is a circuit block diagram of a memory device pertaining to an embodiment of the present invention as relates to a stored logical "1"

FIG. 11 is a circuit block diagram of a memory device pertaining to an embodiment of the present invention as relates to a stored logical 1. In the circuit diagram, elements identical to those in FIG. 9 are assigned the same symbols. A difference with FIG. 9 is that a dump memory 60 is disposed next to memory cell MC (the main memory), and a third sense amplifier 61 is provided in place of the second sense amplifier 50. The erase circuit 62 is a circuit of the type provided to ordinary nonvolatile memories. The dump memory 60 is provided with a bit line selection gate 24a and a switching circuit 20a for switching the source potential of the memory cell. The third sense amplifier 61 is provided with a logical "1" monitor level $V_{M1}$ as the reference voltage $V_{ref}$ As shown in FIG. 8, this monitor level $V_{M1}$ has a potential lower than that of the read level $V_{read}$ and higher than that of the erase verify level $V_{ERASE}$. Accordingly, before the threshold value Vth of the memory cell storing a logical "1" or the output $V_{out}$ of the pre-sense amplifier 25 has risen to the corresponding read level $V_{read}$, the sense amplifier 61 senses that the corresponding monitor level $V_{M1}$ has been reached. At this point, as in the case of a logical "0", the EOR circuit 51 senses that the outputs of the two sense amplifiers 26 and 61 are not the same.

The sensor output is output to the outside through the output buffer 53, and is also provided to the control circuit 54. The control circuit 54 controls the erase circuit 62 such that the erase operation required for rewriting the logical "1" is performed.

Figure 12:
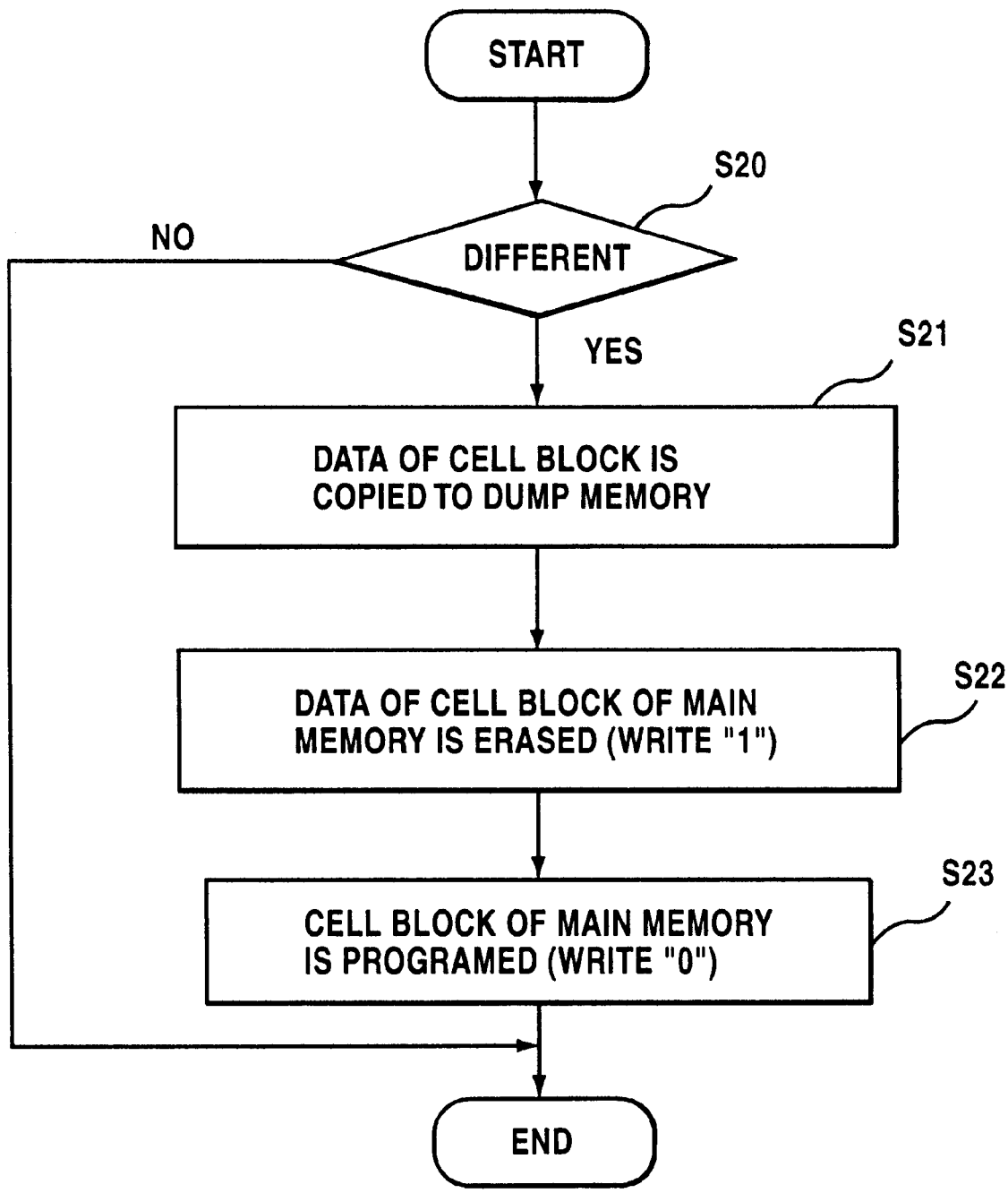
FIG. 12 is a flow chart of an erase operation for re-writing a logical "1"

FIG. 12 is a flow chart depicting the erase operation required for rewriting a logical 1. In general, erase operations in nonvolatile memories are not performed on single memory cells, but rather on groupings (arrays or blocks) comprising a plurality of memory cells. In this embodiment, data in a memory block to which a target memory cell on which a logical "1" re-write is to be performed is temporarily copied to the dump memory area 60 (step S21), and the target memory block within the main memory Mc is erased (step S22). As mentioned earlier, in the erase operation, the voltages applied during the erase operation continue until the pre-sense amplifier output $V_{out}$ falls below the erase verify level $V_{ERASE}$. Subsequently, of the data held in the dump memory, only the logical "0"s are programmed into the corresponding memory cells (step S23).

During erase procedures as well, the verify level $V_{ERASE}$ used for verification is provided as the reference voltage $V_{ref}$ to the sense amplifier 26, and the EOR circuit 51 senses that the outputs of the sense amplifiers 26 and 61 are the same.

Figure 13:
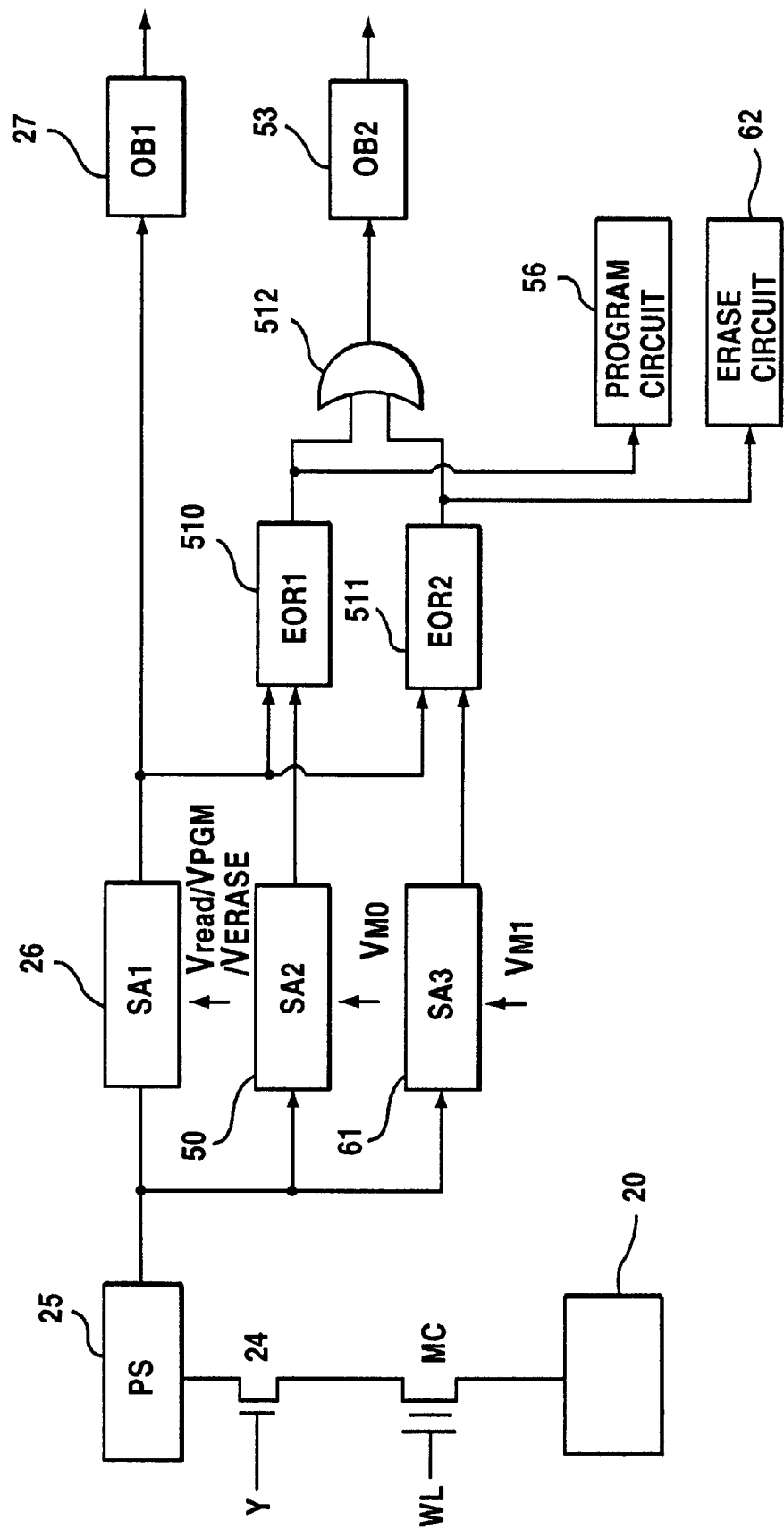
FIG. 13 is a diagram illustrating an embodiment of the present invention for detection both of stored logical "0" deterioration and stored logical "1" deterioration.
Figure 14:
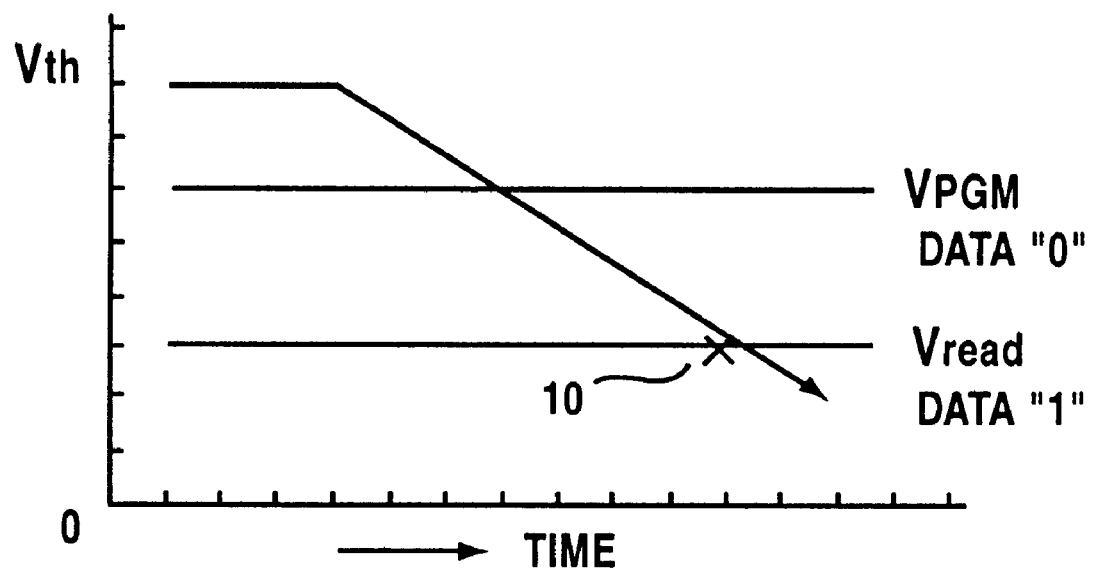
FIG. 14 is a diagram illustrating drawbacks of the prior art.

FIG. 13 illustrates an embodiment by which deterioration of stored logical "0"s and deterioration of logical "1"s may be sensed simultaneously. In this example, an ordinary sense amplifier 26, a second sense amplifier 50 for sensing deterioration of stored logical "0"s, and a third sense amplifier 61 for sensing deterioration of stored logical "1"s are provided. A first EOR circuit 510 senses non-identity of the outputs of the first and second sense amplifiers 26 and 50, and a second EOR circuit 511 senses non-identity of the outputs of the first and second sense amplifiers 26 and 61. In other words, the first EOR circuit 510 has the same function as the EOR circuit 51 in FIG. 9, and the second EOR circuit 511 has the same function as the EOR circuit 51 in FIG. 11. The outputs of both EOR circuits 510 and 511 are provided to an OR gate 512, and if non-identity is sensed at either EOR circuit 510, 511, this is output to the outside through the output buffer 53.

When non-identity is sensed by the first EOR circuit 510, this indicates logical "0" deterioration, so a logical "0" is re-written to the corresponding memory cell by the program circuit 56. When non-identity is sensed by the second EOR circuit 511, this indicates logical "1" deterioration, so the contents of the memory block to which the corresponding memory cell belongs is copied to the dump memory, and the memory block is then erased by the erase circuit 62. The data held in the dump memory is again written to the block.

The process of checking for deterioration of stored data may be performed, for example, when the semiconductor memory is powered up. Nonvolatile memory is characterized by holding data even when the power is off, and since the power is turned on when an operation such as a read operation is required, this power-up time can be used for the check. Alternatively, the system may be configured such that checks for stored data deterioration are performed at prescribed time intervals.

In the embodiment described above, monitor levels $V_{M0}$ and $V_{M1}$ are used for sensing deterioration of stored data. Alternatively, the program verify level $V_{PGM}$ and the erase verify level $V_{ERASE}$ may be used respectively as these levels.

When deterioration of stored data is sensed and the data in question is to be re-written, in the event that it is detected that the time required for the re-write, that is, the time over which write voltage is applied, is less than the set time, the determination is made that the data retention capability of the memory cell in question has significantly deteriorated. In such cases, an alarm should be issued to the system from the memory device. The addresses of memory cells in which deterioration of stored data has occurred should be placed in memory, and if deterioration of stored data occurs frequently in a memory cell having the same address, an alarm should be issued to the system.

As demonstrated by the foregoing description, in accordance with the present invention, it is possible to detect data deterioration in a nonvolatile semiconductor memory when the memory retention capability of a memory cell has deteriorated, and to perform a re-writes of the data in the event that it has deteriorated. Accordingly, the data retention can be sustained over a sufficient period of time even when a certain amount of deterioration in memory retention capability has occurred.

We claim:

1. A nonvolatile semiconductor memory device in which each memory cell transistor is maintained at a threshold condition in accordance with stored data, comprising:

a write circuit for changing the threshold condition of the memory cell transistor until exceeding a prescribed write verify level to perform a write operation of the stored data;

a read sensor circuit for detecting whether the threshold condition of the memory cell exceeds a prescribed read reference level;

and stored data degradation sensor circuit for detecting whether the threshold condition of the memory cell exceeds a monitor level, which differs from the read reference level;

wherein, in the event that the stored data degradation sensor circuit detects that the threshold condition of the memory cell does not exceed the monitor level and the read sensor circuit detects that the threshold condition of the memory cell exceeds the read reference level, the write circuit performs a rewrite operation to rewrite a stored data detected by the read sensor circuit to the memory cell.

2. A semiconductor memory device as defined in claim 1, wherein the monitor level is set at a level between the write verify level and the read reference level.

3. A semiconductor memory device as defined in claim 1, wherein the monitor level is set at a level substantially equal to the write verify level.

4. A nonvolatile semiconductor memory device in which each memory cell transistor is maintained at a threshold condition in accordance with stored data, comprising:

a program circuit for changing the threshold condition of the memory cell transistor until exceeding a prescribed write verify level to perform a program operation of the stored data;

a read sensor circuit for detecting whether the threshold condition of the memory cell exceeds a prescribed read reference level;

and a degradation sensor circuit for detecting whether the threshold condition of the memory cell exceeds a program monitor level which has been set at a level between the program verify level and the read reference level;

wherein, in the event that the degradation sensor circuit detects that the threshold condition of the memory cell on which the program operation has been performed does not exceed the program monitor level, the threshold condition of the memory cell is changed until the threshold condition of the memory cell exceeds the program verify level by the program circuit.

5. A nonvolatile semiconductor memory device in which each memory cell transistor is maintained at a threshold condition in accordance with stored data, comprising:

an erase circuit for changing the threshold condition of the memory cell transistor until exceeding a prescribed erase verify level to perform an erase operation of the stored data;

a read sensor circuit for detecting whether the threshold condition of the memory cell exceeds a prescribed read reference level;

and a degradation sensor circuit for detecting whether the threshold condition of the memory cell exceeds an erase monitor level which has been set at a level between the erase verify level and the read reference level;

wherein, in the event that the degradation sensor circuit detects that the threshold condition of the memory cell on which the erase operation has been performed does not exceed the erase monitor level, the erase operation of the stored data is performed on a prescribed memory cell block to which the memory cell belongs, and the corresponding memory cells are subsequently programmed.

6. A semiconductor memory device as defined in claim 5, further comprising:

a dump memory for temporarily holding data stored in the memory cells within the memory cell block, wherein, in the event that the degradation sensor circuit detects that the threshold condition of the memory cell on which the erase operation has been performed does not exceed the erase monitor level, the data stored in the memory cells within the memory cell block is copied to the dump memory, and the memory cell block is then erased and programmed.

\* \* \* \* \*